United States Patent
Carroll et al.

(10) Patent No.: US 11,197,399 B2
(45) Date of Patent: Dec. 7, 2021

(54) ELECTROMAGNETIC PULSE SHIELD

(71) Applicant: Lifeline IP Holdings, LLC, Connersville, IN (US)

(72) Inventors: Alex J. Carroll, Carmel, IN (US); Richard L. Banta, Carmel, IN (US)

(73) Assignee: Lifeline IP Holdings, LLC, Connersville, IN (US)

( * ) Notice: Subject to any disclaimer, the term of this patent is extended or adjusted under 35 U.S.C. 154(b) by 163 days.

(21) Appl. No.: 16/288,501

(22) Filed: Feb. 28, 2019

(65) Prior Publication Data
US 2019/0269045 A1    Aug. 29, 2019

Related U.S. Application Data

(60) Provisional application No. 62/636,488, filed on Feb. 28, 2018.

(51) Int. Cl.
*H05K 9/00* (2006.01)
*H01R 4/04* (2006.01)
(Continued)

(52) U.S. Cl.
CPC ............ *H05K 9/0003* (2013.01); *E04B 1/92* (2013.01); *E04F 13/0848* (2013.01); *E04F 13/12* (2013.01); *E04F 13/26* (2013.01); *E04F 15/02016* (2013.01); *E04F 15/06* (2013.01); *H01R 4/04* (2013.01); *H01R 4/308* (2013.01); *H05K 9/0001* (2013.01); *H05K 9/0009* (2013.01); *H05K 9/0088* (2013.01);
(Continued)

(58) Field of Classification Search
CPC ...... H05K 9/00; H05K 9/0001; H05K 9/0003; H05K 9/0007; H05K 9/0009; H05K 9/0071; H05K 9/0075; H05K 9/0081; H05K 9/0084; H05K 9/0073; H05K 9/0088; G21F 1/08; E04F 13/0848; E04F 13/12; E04F 13/26; H01R 4/04
See application file for complete search history.

(56) References Cited

U.S. PATENT DOCUMENTS 4,733,013 A * 3/1988 Hemming ............ H05K 9/0001
                                                          174/353
5,519,168 A * 5/1996 Owens ................. H05K 9/0084
                                                          174/393
(Continued)

OTHER PUBLICATIONS

Mr. BOBB; What is a Faraday Cage and How to Make One; BugOutBagBuilder.com; published online Sep. 20, 2017; accessed and printed Jan. 14, 2021; https://www.bugoutbagbuilder.com/blog/how-make-your-own-faraday-cage-home; pp. 1-10 (Year: 2017).*

*Primary Examiner* — Edward J. Schmiedel
(74) *Attorney, Agent, or Firm* — Taft Stettinius & Hollister LLP

(57) ABSTRACT

A method according to one embodiment includes securing a first plurality of conductive sheets to a surface, applying a conductive tape to a first plurality of joints between conductive sheets of the first plurality of conductive sheets, and securing a second plurality of conductive sheets to the first plurality of conductive sheets without fully penetrating the first plurality of conductive sheets. In such an embodiment, each of a second plurality of joints between conductive sheets of the second plurality of conductive sheets is offset relative to the first plurality of joints.

17 Claims, 11 Drawing Sheets

(51) Int. Cl.
    *H01R 4/30*     (2006.01)
    *E04B 1/92*     (2006.01)
    *E04F 15/06*     (2006.01)
    *E04F 15/02*     (2006.01)
    *E04F 13/12*     (2006.01)
    *E04F 13/26*     (2006.01)
    *E04F 13/08*     (2006.01)
    *E04H 9/04*     (2006.01)
    *E04H 5/00*     (2006.01)
    *E04H 9/16*     (2006.01)

(52) U.S. Cl.
    CPC .......... *E04B 2001/925* (2013.01); *E04H 9/04* (2013.01); *E04H 9/16* (2013.01); *E04H 2005/005* (2013.01)

(56) References Cited

U.S. PATENT DOCUMENTS

| | | | |
|---|---|---|---|
| 10,519,672 B1 * | 12/2019 | Hansen | E06B 5/18 |
| 2008/0233426 A1 * | 9/2008 | Gaviglia | B32B 15/013 |
| | | | 428/648 |
| 2010/0294559 A1 * | 11/2010 | Izawa | H05K 9/0024 |
| | | | 174/378 |
| 2019/0029147 A1 * | 1/2019 | Cordes | B32B 15/12 |

* cited by examiner

ELECTROMAGNETIC PULSE SHIELD

CROSS-REFERENCE TO RELATED APPLICATIONS

This application claims the benefit of U.S. Provisional Application No. 62/636,488 filed on Feb. 28, 2018, the contents of which are incorporated herein by reference in their entirety.

BACKGROUND

An electromagnetic pulse (EMP) is a burst of electronic energy that can occur naturally or by virtue of a man-made disturbance. Such EMPs may be large-scale disruptions that effect entire cities or small-scale disruptions that affect a single building. Regardless of the scale, the damage an EMP can cause to electronics has the potential to have staggering implications including, for example, enormous financial losses associated with sophisticated electronics equipment rendered useless, data breaches during a subsequent equipment repair phase, and/or unrecoverable data loss. There are various techniques for reducing the electromagnetic field associated with an EMP in an attempt to reduce or eliminate potential damage; however, it should be appreciated that there is a need for improved techniques for efficient and cost-effective construction of EMP shields for secure buildings and critical infrastructure.

SUMMARY

According to one aspect, a method according to one embodiment may include securing a first plurality of conductive sheets to a surface, applying a conductive tape to a first plurality of joints between conductive sheets of the first plurality of conductive sheets, and securing a second plurality of conductive sheets to the first plurality of conductive sheets without fully penetrating the first plurality of conductive sheets. Each of a second plurality of joints between conductive sheets of the second plurality of conductive sheets may be offset relative to the first plurality of joints.

In some embodiments, each conductive sheet of the first plurality of conductive sheets and the second plurality of conductive sheets may be galvanized sheet metal. The conductive tape may include an aluminum backing and a conductive acrylic adhesive.

In some embodiments, securing the first plurality of conductive sheets to the surface may include placing the first plurality of conductive sheets on the surface adjacent one another and screwing the first plurality of conductive sheets to the surface.

In some embodiments, securing the second plurality of conductive sheets to the first plurality of conductive sheets may include placing the second plurality of conductive sheets on the first plurality of conductive sheets adjacent one another such that each longitudinal joint between conductive sheets of the second plurality of conductive sheets is offset from each longitudinal joint between conductive sheets of the first plurality of conductive sheets by a first distance, and each lateral joint between conductive sheets of the second plurality of conductive sheets is offset from each lateral joint between conductive sheets of the first plurality of conductive sheets by a second distance. In some embodiments, each conductive sheet of the first plurality of conductive sheets and the second plurality of conductive sheets has a same length and width, and the first distance is half the width and the second distance is half the length. Further, securing the second plurality of conductive sheets to the first plurality of conductive sheets further may include screwing the second plurality of conductive sheets to the first plurality of conductive sheets with self-tapping screws without fully penetrating the first plurality of conductive sheets. In particular, screwing the second plurality of conductive sheets to the first plurality of conductive sheets may include screwing the second plurality of conductive sheets to the first plurality of conductive sheets with self-tapping screws at every nine inches in both a longitudinal direction and a lateral direction.

In some embodiments, the surface is a first surface that meets a second surface at a surface joint, and the method may further include securing an angled conductive sheet to at least one conductive sheet of the first plurality of conductive sheets at the surface joint in response to securing the first plurality of conductive sheets to the first surface, and securing at least one conductive sheet of the second plurality conductive sheets to the angled conductive sheet in response to securing the angled conductive sheet to the at least one conductive sheet of the first plurality of conductive sheets.

In some embodiments, the method may further include applying a protective coating to the second plurality of conductive sheets.

According to another aspect, an electromagnetic pulse shield may include at least six surfaces connected to form a chamber within a building, wherein each surface of the at least six surfaces may include a first plurality of conductive sheets secured to a corresponding surface of the building, wherein a first plurality of joints between conductive sheets of the first plurality of conductive sheets are joined by a conductive tape, and a second plurality of conductive sheets secured to the first plurality of conductive sheets. Each of a second plurality of joints between conductive sheets of the second plurality of conductive sheets may be offset relative to the first plurality of joints.

In some embodiments, each conductive sheet of the first plurality of conductive sheets and the second plurality of conductive sheets may be galvanized sheet metal. The conductive tape may include an aluminum backing and a conductive acrylic adhesive.

In some embodiments, the second plurality of conductive sheets may be secured to the first plurality of conductive sheets such that each longitudinal joint between conductive sheets of the second plurality of conductive sheets is offset from each longitudinal joint between conductive sheets of the first plurality of conductive sheets by a first distance, and each lateral joint between conductive sheets of the second plurality of conductive sheets is offset from each lateral joint between conductive sheets of the first plurality of conductive sheets by a second distance. In some embodiments, each conductive sheet of the first plurality of conductive sheets and the second plurality of conductive sheets may have a same length and width, and the first distance is half the width and the second distance is half the length.

In some embodiments, the chamber may be defined by the at least six surfaces and at least twelve surface joints, each of the at least twelve surface joints may be formed by a meeting of two corresponding surfaces of the at least six surfaces, and the electromagnetic pulse shield may further include at least one angled conductive sheet secured to each of the at least twelve surface joints between one or more corresponding conductive sheets of the first plurality of conductive sheets and one or more corresponding conductive sheets of the second plurality of conductive sheets.

According to yet another aspect, a building structure may include four wall surfaces, a ceiling surface, and a floor surface connected at building surface joints to form a room.

The building structure may further include an electromagnetic pulse shield surface secured to each of the four wall surfaces, the ceiling surface, and the floor surface. Each electromagnetic pulse shield surface may include a first layer of conductive sheets secured to a corresponding surface of the four wall surfaces, the ceiling surface, or the floor surface, wherein a first set of joints between conductive sheets of the first layer of conductive sheets are joined by a conductive tape, and a second layer of conductive sheets secured to the first layer of conductive sheets, wherein each of a second set of joints between conductive sheets of the second layer of conductive sheets is offset relative to the first set of joints.

In some embodiments, the building structure may further include at least one angled conductive sheet secured at each of the building surface joints between one or more corresponding conductive sheets of the first layer of conductive sheets and one or more corresponding conductive sheets of the second layer of conductive sheets.

In some embodiments, each conductive sheet of the first layer of conductive sheets and the second layer of conductive sheets may be galvanized sheet metal, and the conductive tape may include an aluminum backing and a conductive acrylic adhesive.

In some embodiments, the first layer of conductive sheets secured to a bottom electromagnetic pulse shield surface may be secured with a plurality of lead anchor pins.

Further embodiments, forms, features, and aspects of the present application shall become apparent from the description and figures provided herewith.

BRIEF DESCRIPTION OF THE DRAWINGS

The concepts described herein are illustrative by way of example and not by way of limitation in the accompanying figures. For simplicity and clarity of illustration, elements illustrated in the figures are not necessarily drawn to scale. Where considered appropriate, references labels have been repeated among the figures to indicate corresponding or analogous elements.

DETAILED DESCRIPTION

Figure 1:
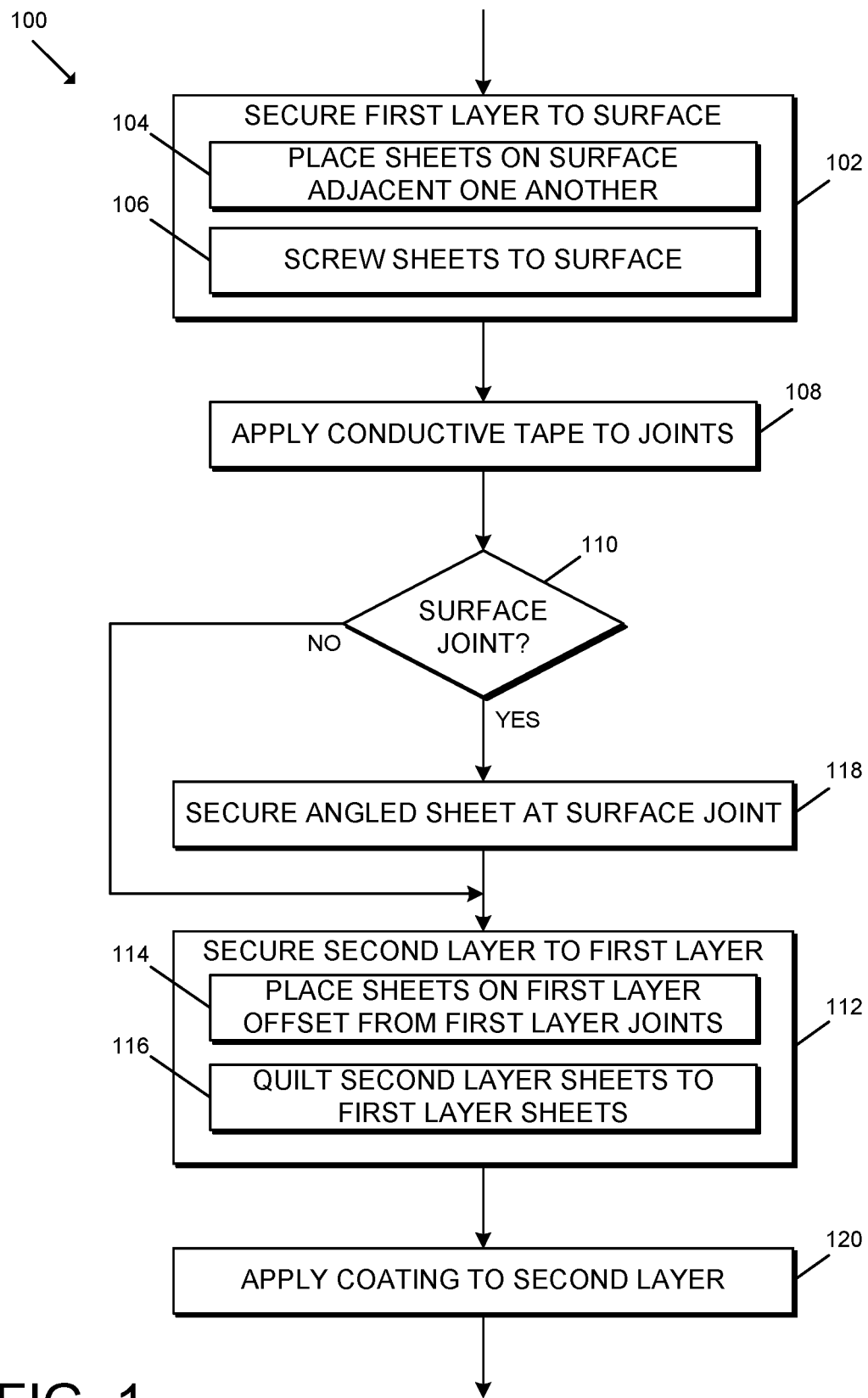
FIG. 1 is a simplified block diagram of at least one embodiment of a method for assembling an EMP shield.

Although the concepts of the present disclosure are susceptible to various modifications and alternative forms, specific embodiments have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. It should further be appreciated that although reference to a "preferred" component or feature may indicate the desirability of a particular component or feature with respect to an embodiment, the disclosure is not so limiting with respect to other embodiments, which may omit such a component or feature. Further, when a particular feature, structure, or characteristic is described in connection with an embodiment, it is submitted that it is within the knowledge of one skilled in the art to implement such feature, structure, or characteristic in connection with other embodiments whether or not explicitly described. Additionally, it should be appreciated that items included in a list in the form of "at least one of A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C). Further, with respect to the claims, the use of words and phrases such as "a," "an," "at least one," and/or "at least one portion" should not be interpreted so as to be limiting to only one such element unless specifically stated to the contrary, and the use of phrases such as "at least a portion" and/or "a portion" should be interpreted as encompassing both embodiments including only a portion of such element and embodiments including the entirety of such element unless specifically stated to the contrary.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures unless indicated to the contrary. Additionally, the inclusion of a structural or method feature in a particular figure is not meant to imply that such feature is required in all embodiments and, in some embodiments, may not be included or may be combined with other features.

The terms longitudinal, lateral, and transverse may be used to denote motion or spacing along three mutually perpendicular axes, wherein each of the axes defines two opposite directions. The directions defined by each axis may also be referred to as positive and negative directions. Additionally, the descriptions that follow may refer to the directions defined by the axes with specific reference to the orientations illustrated in the figures. For example, the directions may be referred to as distal/proximal, left/right, and/or up/down. It should be appreciated that such terms may be used simply for ease and convenience of description and, therefore, used without limiting the orientation of the system with respect to the environment unless stated expressly to the contrary. For example, descriptions that reference a longitudinal direction may be equally applicable to a vertical direction, a horizontal direction, or an off-axis orientation with respect to the environment. Furthermore, motion or spacing along a direction defined by one of the axes need not preclude motion or spacing along a direction defined by another of the axes. For example, elements described as being "laterally offset" from one another may also be offset in the longitudinal and/or transverse directions, or may be aligned in the longitudinal and/or transverse directions. The terms are therefore not to be construed as further limiting the scope of the subject matter described herein.

It should be appreciated that the techniques described below may be employed to assemble an EMP shield (see, for example, the EMP shield 10 of FIG. 11) in an efficient and cost-effective manner to protect secure structures such as, for example, data centers. In some embodiment, the EMP shield may eliminate up to 10 GHz of energy penetrated into the system and handle up to 120 dB of noise. As described in greater detail below, the illustrative EMP shield is constructed of multiple layers of conductive sheets secured to each of the walls, the ceiling, and the floor of the room or building structure that cooperate to dissipate an electromagnetic pulse, thereby preventing the electromagnetic pulse from further penetrating the room or structure and, for example, damaging the electronics stored therein.

Referring now to FIG. 1, a method 100 for assembling an EMP shield is shown. It should be appreciated that the particular blocks of the method 100 are illustrated by way of example, and such blocks may be combined or divided, added or removed, and/or reordered in whole or in part depending on the particular embodiment, unless stated to the contrary. The illustrative method 100 begins with block 102 in which a first layer of conductive sheets 12 is secured to a surface 14 of a building structure as shown in FIGS. 2-3.

In particular, in block 104, the conductive sheets 12 are placed on the surface 14 to which they are to be secured and positioned directly adjacent one another, minimizing or eliminating any gap between adjacent conductive sheets 12. It should be appreciated that the attachment mechanism used to secure the conductive sheets 12 to the surface 14 may vary depending on the particular circumstances. For example, a different attachment mechanism may be used to secure the conductive sheets 12 to the floor of the structure than to secure the conductive sheets 12 to a wall or ceiling of the structure. In block 106, the conductive sheets 12 may be secured to a wall or ceiling with screws 16 that secure the conductive sheets 12 to corresponding studs in the wall or ceiling. Further, the screws 16 may have a low-profile head and may be screwed into the surface 14 just enough to dimple the corresponding conductive sheet 12. However, the conductive sheets 12 may be secured to a concrete floor with adhesive, lead anchor pins (i.e., anchor pins composed of lead material), and/or other suitable attachment mechanisms. In embodiments in which the floor is of wood construction, techniques similar to attachment to the walls may be used.

In the illustrative embodiment, each of the conductive sheets 12 is formed of 26-gauge galvanized sheet metal and is eight feet long (in the longitudinal direction 18) and four feet wide (in the lateral direction 20). In other embodiments, however, the conductive sheets 12 may be formed of any one or more materials having characteristics that permit sufficient dissipation of electromagnetic pulses as described herein.

Figure 2:
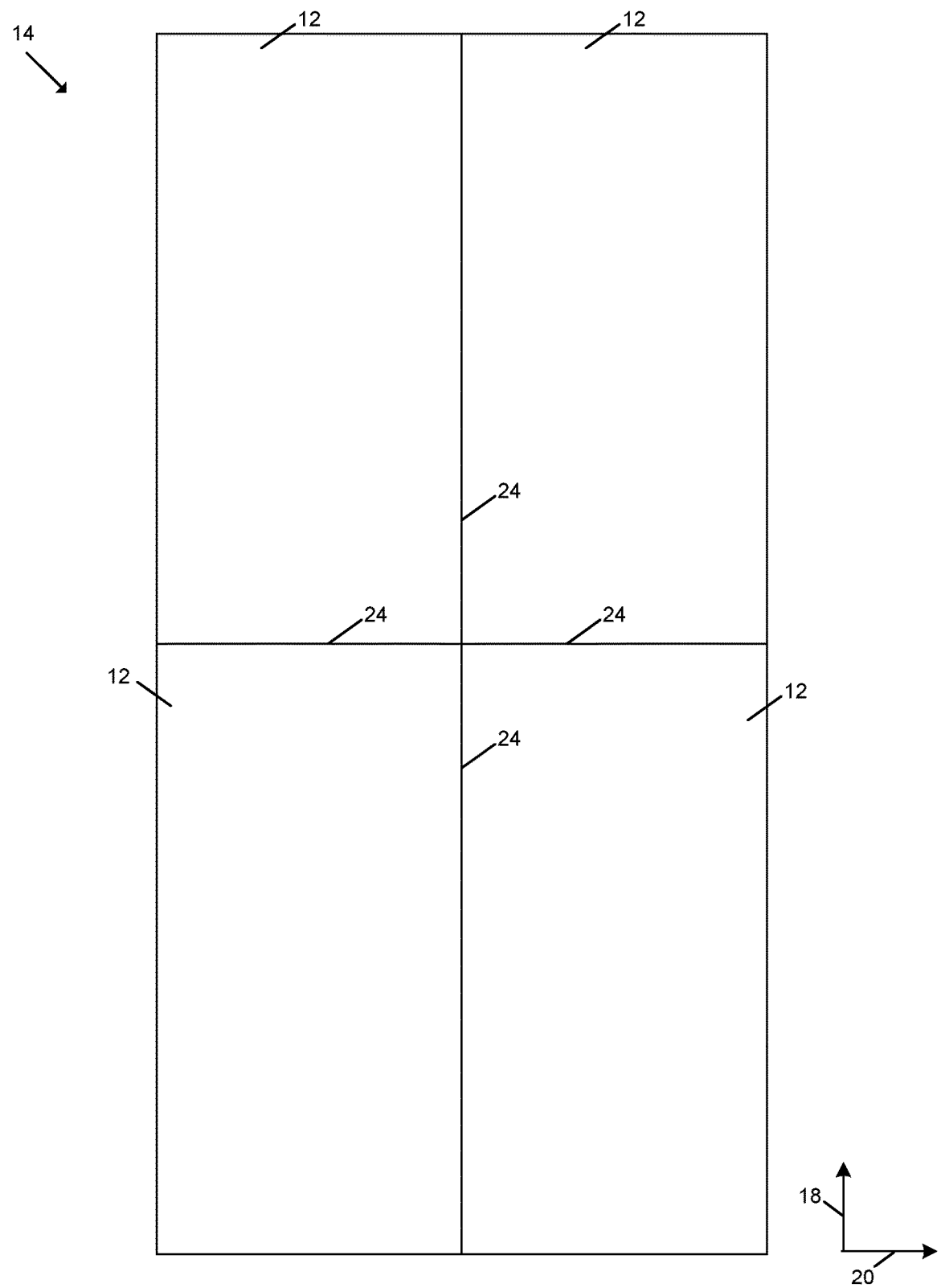
FIG. 2 is a plan view of a plurality of sheets of a first layer of the EMP shield positioned for attachment to an underlying surface.
Figure 3:
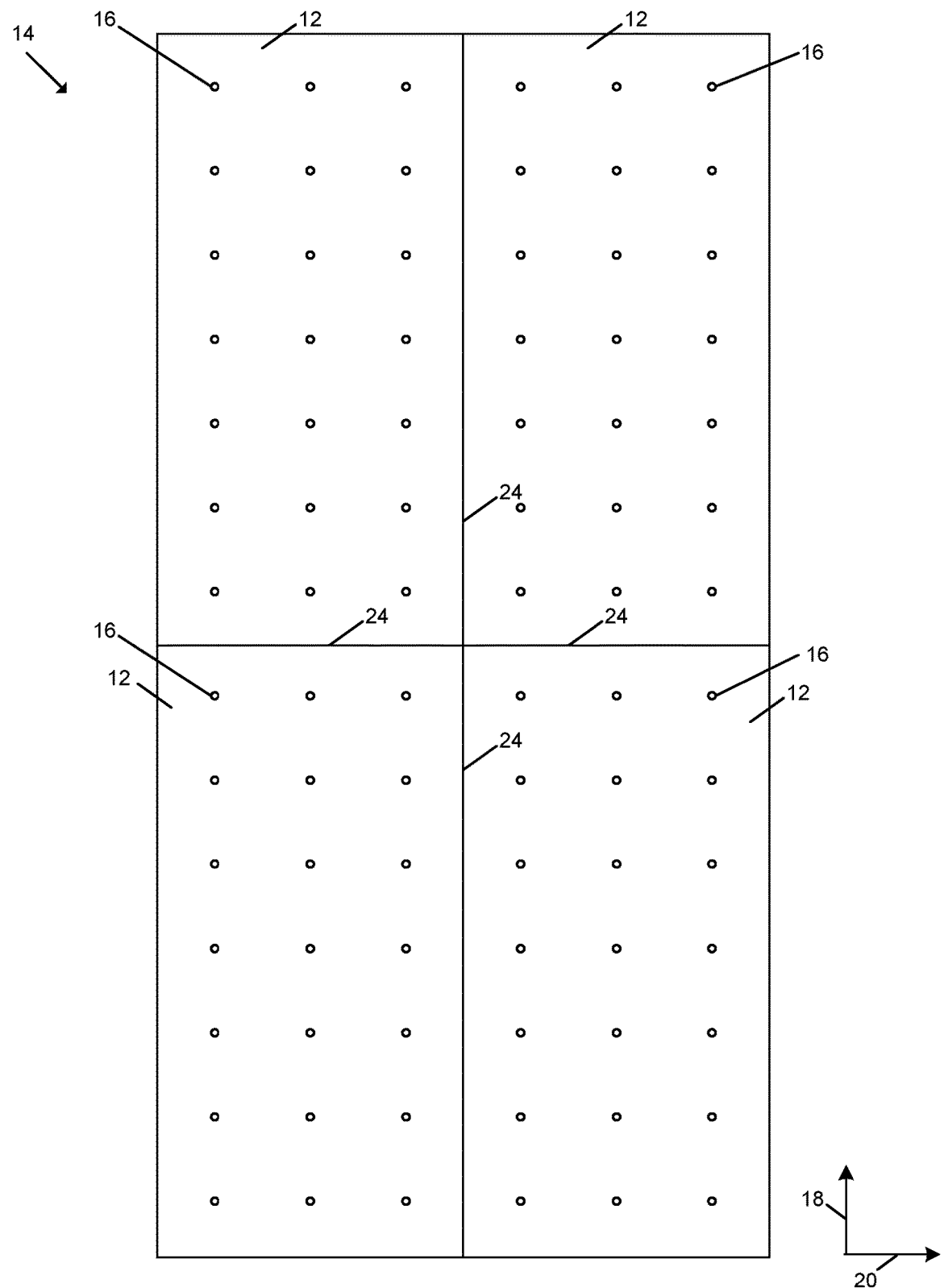
FIG. 3 is a plan view of the plurality of sheets of FIG. 2 screwed to the underlying surface.

Although four conductive sheets 12 are illustratively shown in FIGS. 2-3, it should be appreciated that a greater or lesser number of sheets 12 may be secured to the surface 14 depending on the size of the structure and the dimensions of the sheets 12. Further, although the conductive sheets 12 are the same size and shape in the illustrative embodiment, the conductive sheets 12 may have different sizes and/or shapes in other embodiments and still be consistent with the techniques described herein.

Figure 4:
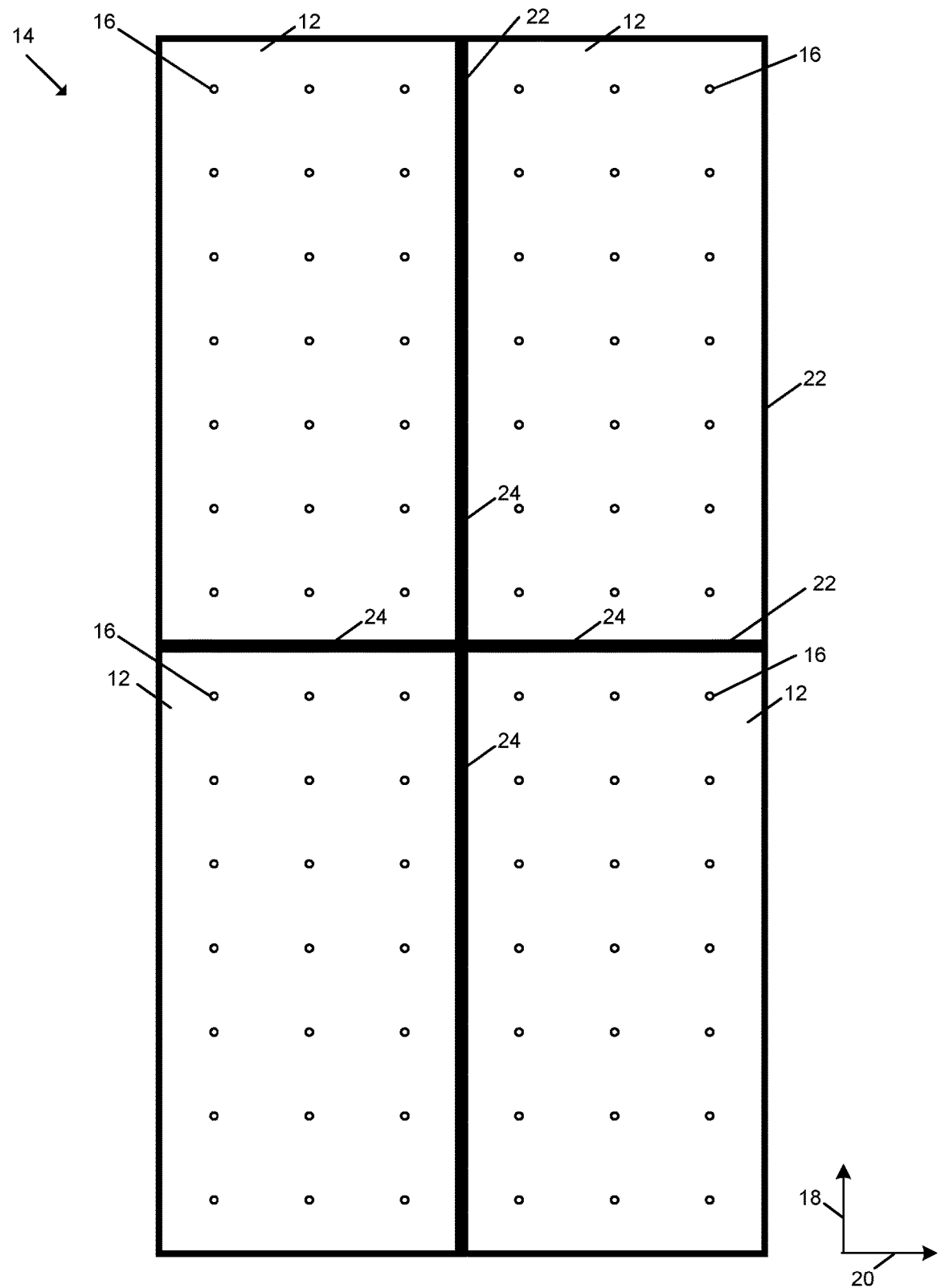
FIG. 4 is a plan view of the plurality of sheets of FIG. 3 with conductive tape applied to the joints between the sheets.

In block 108, after the first layer of conductive sheets 12 have been secured to the surface 14 of the building structure, a conductive tape 22 may be applied to the joints 24 between the conductive sheets 12 as shown in FIG. 4. As described below in references to FIGS. 9-10, the conductive tape 22 may also be applied to the surface joints at which two or more surfaces of the EMP shield meet (e.g., two walls meet, wall and floor meet, wall and ceiling meet, etc.). It should be appreciated that common tapes generally have an adhesive with sufficient resistivity that electrical conductivity is small or even negligible. However, in the illustrative embodiment, the conductive tape 22 is a tape with an aluminum backing and a conductive acrylic adhesive, which allows electricity to flow between the conductive sheets 12 to which the conductive tape 22 is secured. In other words, the conductive tape 22 functions to create an electrical short across adjacent conductive sheets 12. In other embodiments, another conductive tape 22 with a suitable conductive backing and conductive adhesive may be used.

In block 110, the engineer assembling the EMP shield determines whether one or more of the conductive sheets 12 of the section of the EMP shield currently being assembled are at a surface joint at which two or more surfaces of the EMP shield meet. As indicated above, the particular surface joints may be dictated by the shape and dimensions of the surfaces of the building structure to which the EMP shield is intended to be secured.

Figure 5:
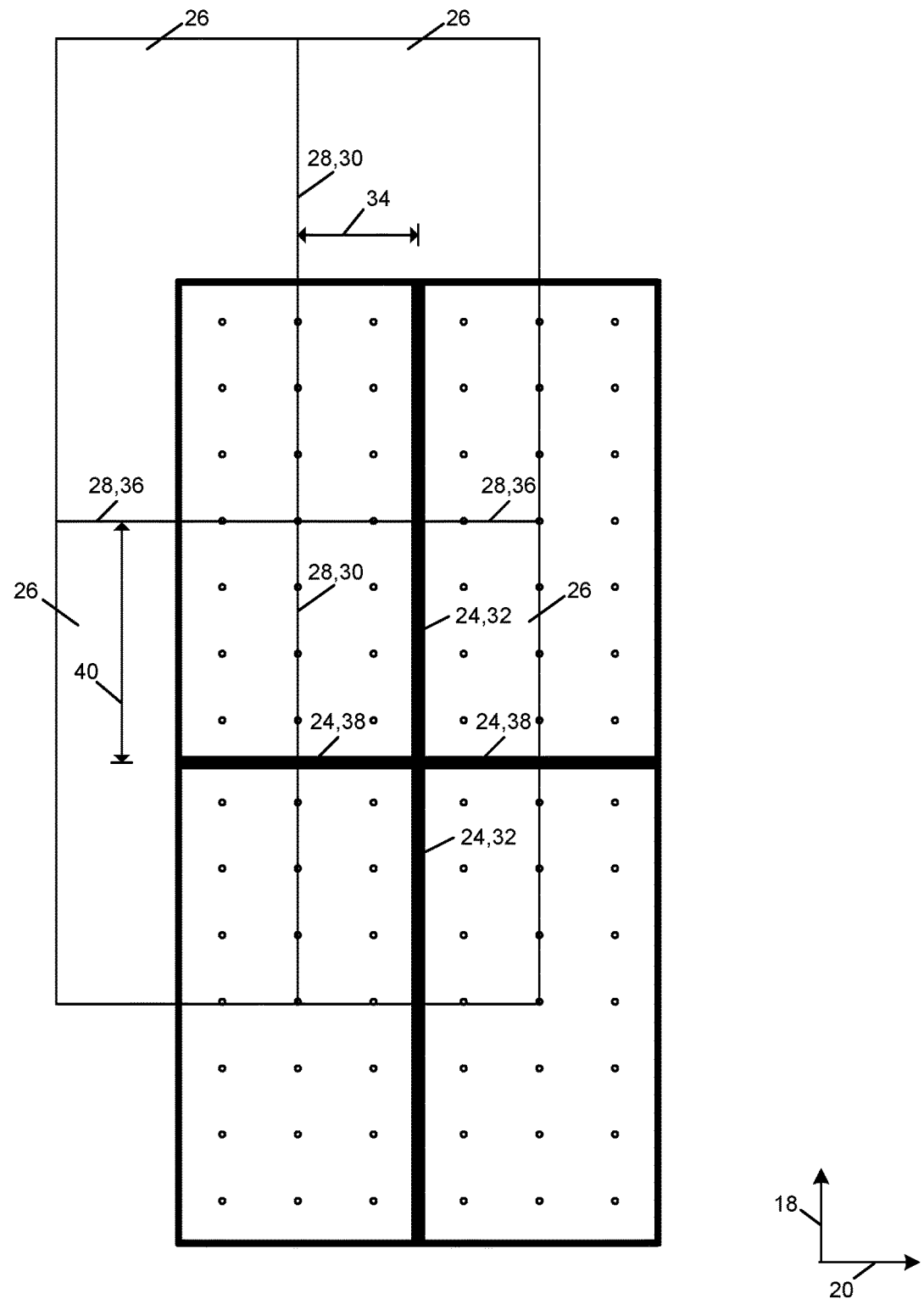
FIG. 5 is a multilayer plan view of a plurality of sheets of a second layer of the EMP shield positioned for attachment to the plurality of sheets of the first layer of FIG. 4.
Figure 6:
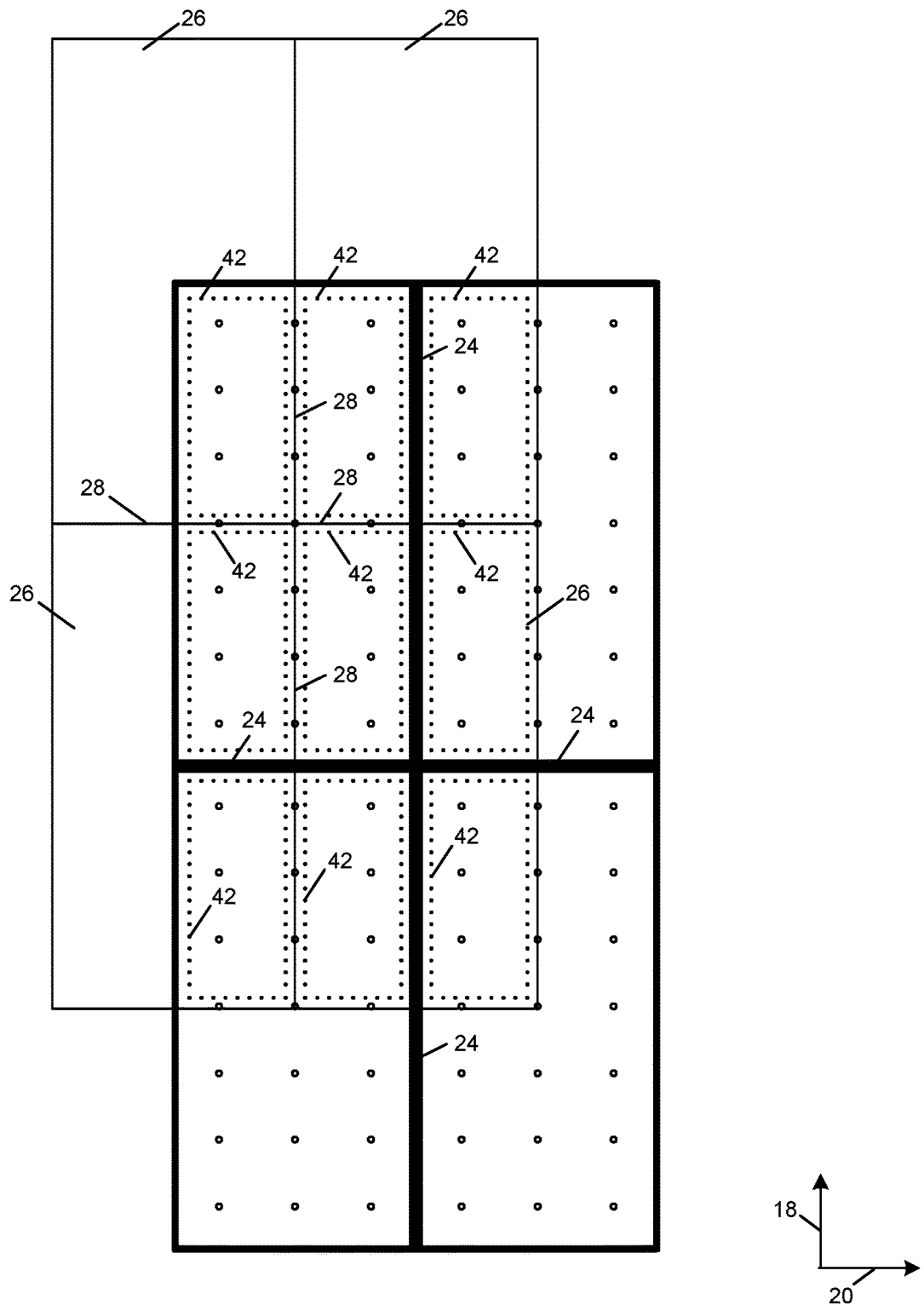
FIG. 6 is a multilayer plan view of the plurality of sheets of the second layer of FIG. 5 quilted to the first layer of FIG. 4.

If there is no surface joint at the section of the EMP shield currently being assembled, the method 100 advances to block 112 in which a second layer of conductive sheets 26 is secured to the first layer of conductive sheets 12 (e.g., to protect the first layer) as shown in FIGS. 5-6. In the illustrative embodiment, each of the conductive sheets 26 is similar to the conductive sheets 12 described above. As such, each of the conductive sheets 26 is formed of 26-gauge galvanized sheet metal and is eight feet long and four feet wide. In other embodiments, however, the conductive sheets 26 may be formed of any one or more materials having characteristics that permit sufficient dissipation of electromagnetic pulses as described herein. Further, in some embodiments, the conductive sheets 26 may be have a different size and/or shape from the conductive sheets 12 and/or the conductive sheets 26 may vary among one another within the second layer.

In order to secure the second layer of conductive sheets 26 to the first layer, in block 114, the second layer of conductive sheets 26 are placed on the first layer of conductive sheets 12 such that the joints 28 between the conductive sheets 26 of the second layer are offset relative to the joints 24 of the first layer of conductive sheets 12 as shown in FIG. 5. In particular, in some embodiments, each longitudinal joint 30 between conductive sheets 26 of the second layer may be offset from each longitudinal joint 32 between conductive sheets 12 of the first layer by a first distance 34, and each lateral joint 36 between conductive sheets 26 of the second layer may be offset from each lateral joint 38 between conductive sheets 12 of the first layer by a second distance 40. More specifically, in the illustrative embodiment, the first distance 34 is equal to half the width of the conductive sheets 12, 26 and the second distance is equal to half the length of the conductive sheets 12, 26 such that there is a 50% offset between the conductive sheets 26 of the second layer and the conductive sheets 12 of the first layer in both the longitudinal direction 18 and lateral direction 20. In other embodiments, the longitudinal and/or lateral offset may be different.

In block 116, the second layer of conductive sheets 26 is "quilted" to the first layer of conductive sheets 12 with suitable fasteners 42. In particular, in the illustrative embodiment, the conductive sheets 26 is screwed to the conductive sheets 12 with self-tapping screws without fully penetrating the first layer of conductive sheets 12. It should be appreciated that the number and location of the fasteners 42 may vary depending on the particular embodiment. For example, in some embodiments, the second layer of conductive sheets 26 is screwed to the first layer of conductive sheets 12 with self-tapping screws at every nine inches in both the longitudinal direction 18 and the lateral direction 20. Accordingly, although FIG. 6 illustrates only the periphery of each "cell" defined by the joints 24, 28 being secured with the fasteners 42, in the illustrative embodiment, the second layer of conductive sheets 26 is secured to the first layer of conductive sheets 12 by a "full" array of fasteners 42 within each cell. In the illustrative embodiment, no fastener 42 fully penetrates the first layer or is positioned to be driven into a joint 24 of the first layer.

It should be appreciated that FIG. 6 shows the conductive sheets 26 of the second layer extending beyond the conductive sheets 12 of the first layer in both the longitudinal direction 18 and the lateral direction 20 for clarity of the description. In the illustrative embodiment, however, no portion of the surfaces of the building structure to which the EMP shield is secured includes only the second layer of conductive sheets 26; instead, each surface of the EMP shield is a multilayer system that includes at least the first and second layers of conductive sheets 12, 26. Accordingly, the conductive sheets 26 may be cut to fit the appropriate surface 14 dimensions (e.g., at the periphery of the surface 14). Further, as described below in reference to FIGS. 9-10, additional protection may be provided at the surface joints.

Figure 7:
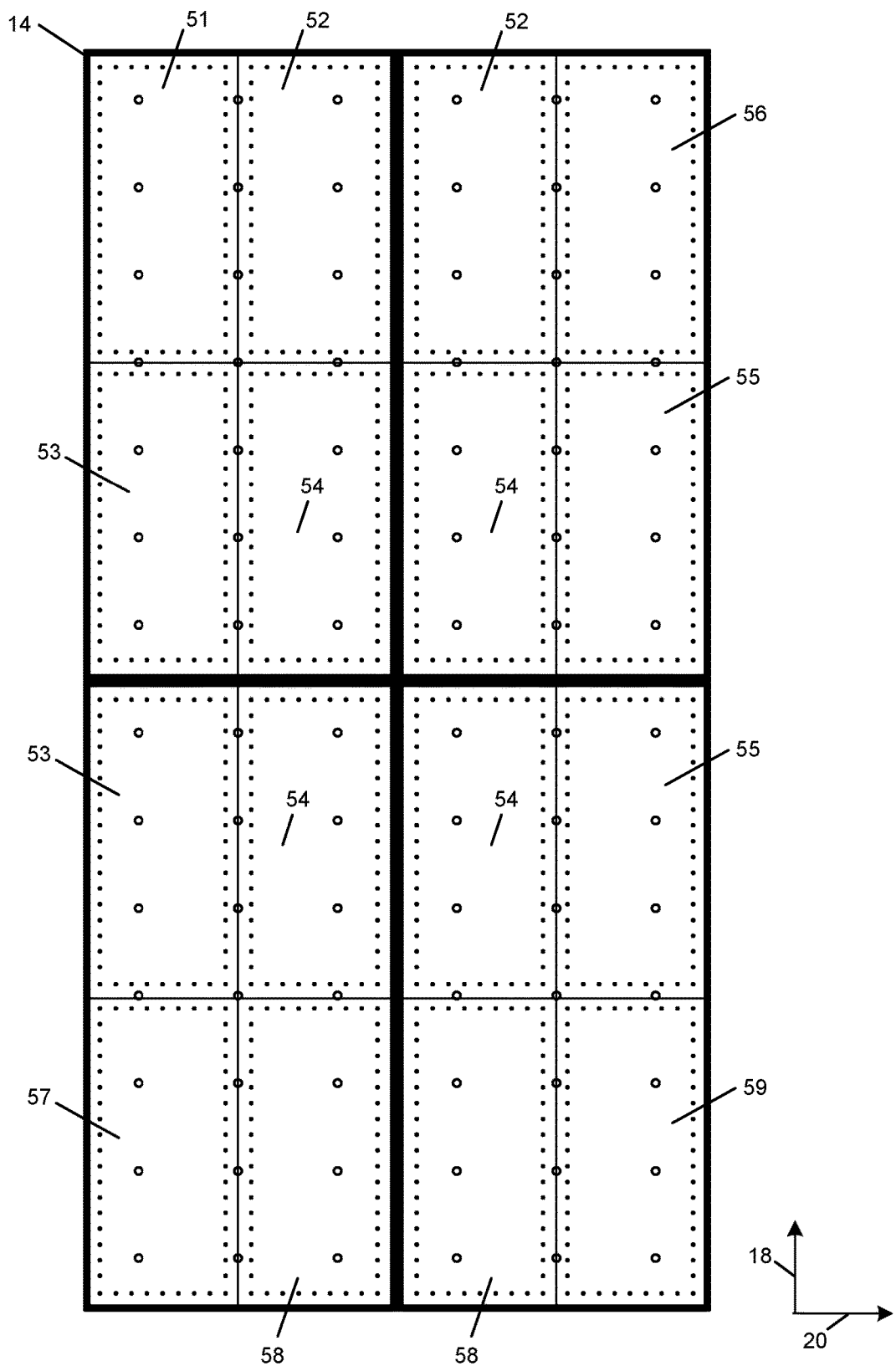
FIG. 7 is a multilayer plan view of at least one embodiment of a portion of the assembled EMP shield.
Figure 8:
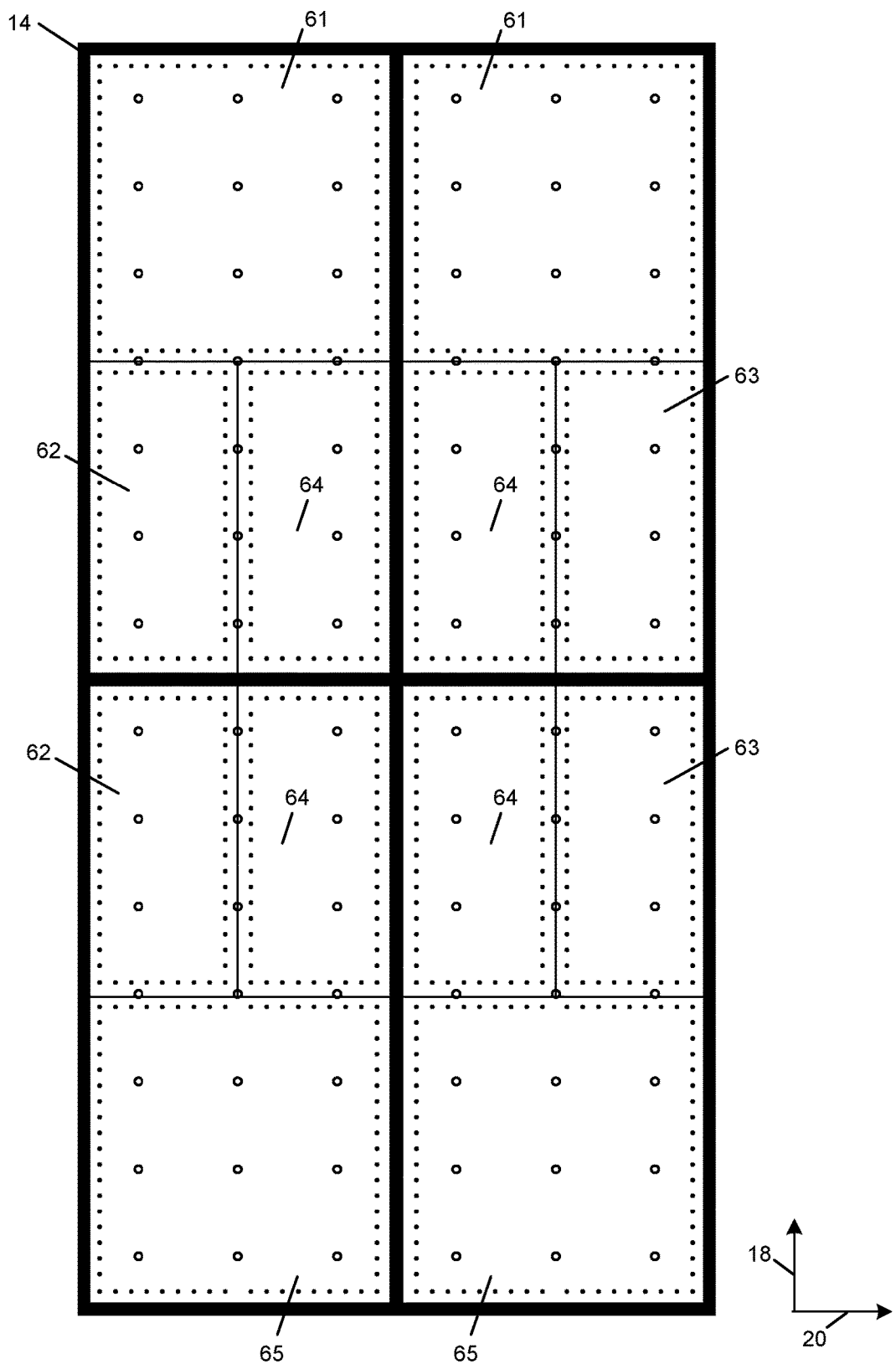
FIG. 8 is a multilayer plan view of at least one other embodiment of the portion of the assembled EMP shield constructed with an alternative sheet layout of the second layer.

FIGS. 7-8 show alternative embodiments of a portion of an EMP shield that is the size and shape of four conductive sheets 12 (i.e., to be secured to a similarly sized surface 14). More specifically, FIGS. 7-8 show alternative sheet layouts for the conductive sheets 26 of the second layer consistent with the techniques described herein. It should be appreciated that the sheet layout of FIG. 7 continues the pattern of FIG. 6; however, the conductive sheets 26 are cut to fit the dimensions of the surface 14. As such, the sheet layout of FIG. 7 requires the use of nine conductive sheets 26 (conductive sheets 51, 52, 53, 54, 55, 56, 57, 58, 59) that have been cut to fit the surface 14 dimensions and to otherwise remain consistent with the techniques described herein. Alternatively, FIG. 8 shows another sheet layout for the conductive sheets 26 of the second layer that requires fewer cuts and, nonetheless, remains otherwise consistent with the techniques described herein. More specifically, the sheet layout of FIG. 8 requires the use of five conductive sheets 26 (conductive sheets 61, 62, 63, 64, 65). It should be appreciated that the conductive sheets 26 of FIGS. 5-8 are illustratively shown as transparent for clarity of the description.

Figure 9:
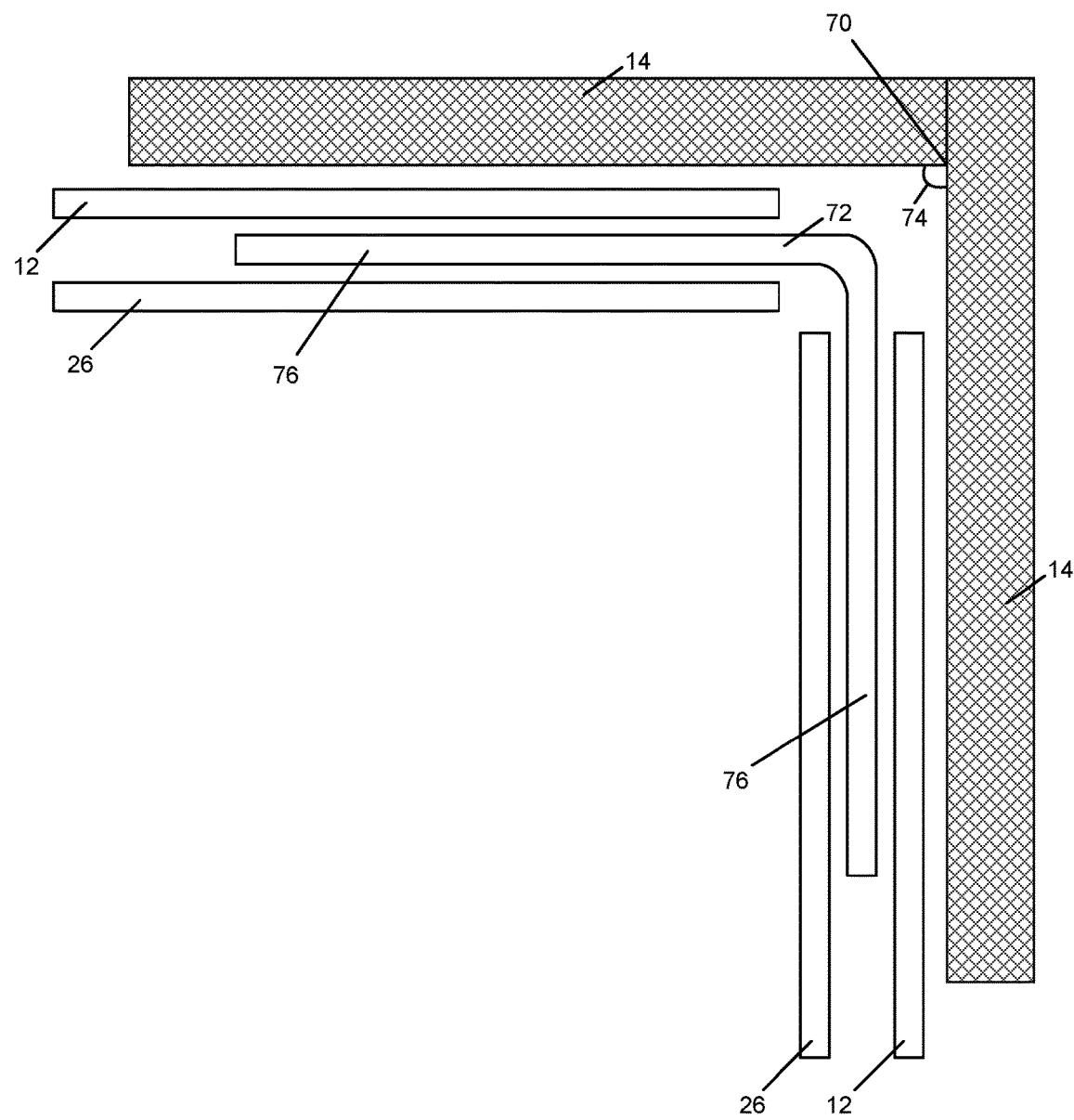
FIG. 9 is an exploded cross-sectional view of a surface joint of the assembled EMP shield.
Figure 9:
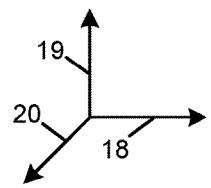
Figure 10:
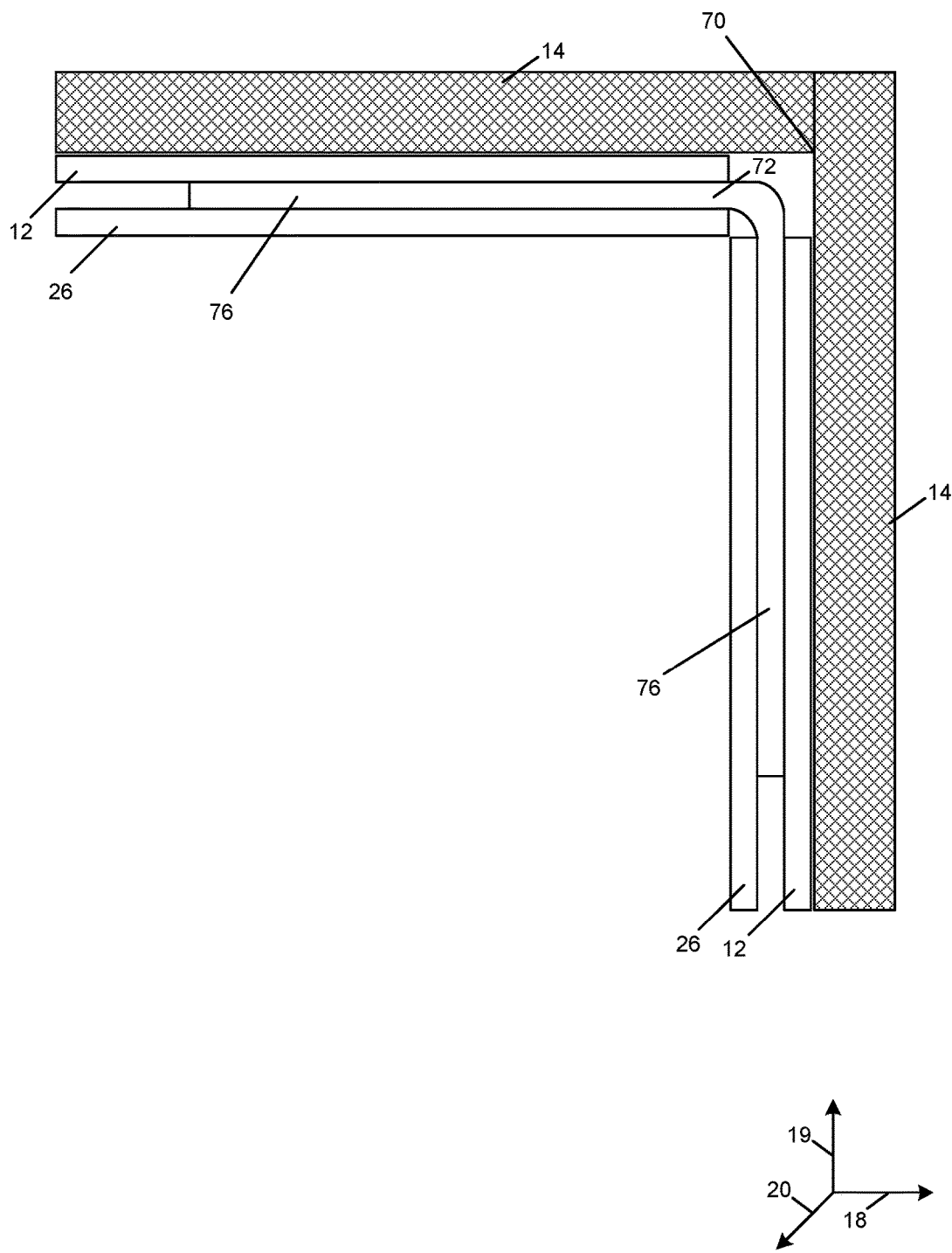
FIG. 10 is a cross-sectional view of the surface joint of the assembled EMP shield.

Returning to block 110 of FIG. 1, if there is a surface joint 70 at the section of the EMP shield currently being assembled, the method 100 advances to block 118 in which one or more angled conductive sheets 72 are secured at the surface joint 70 as shown in FIGS. 9-10. As described above, a surface joint 70 is a point at which two surfaces 14 of the building structure meet. In the illustrative embodiment, the angled conductive sheet 72 is a similar material as the conductive sheets 12, 26 (e.g., 26-gauge galvanized sheet metal) but bent at an angle corresponding with an angle 74 of the surface joint 70 (i.e., the angle between the surfaces 14 with the surface joint 70 as the vertex). In some embodiments, each leg 76 of the angled conductive sheet 72 is twelve inches in length. In other embodiments, however, the angled conductive sheets 72 may be of a different size and/or shape. For example, in some embodiments, one or more angled conductive sheets 72 may not be bent at an angle that corresponds identically with the angle 74 of the surface joint 70. Further, in some embodiments, the angled conductive sheets 72 may be formed of any one or more materials having characteristics that permit sufficient dissipation of electromagnetic pulses as described herein.

In the illustrative embodiment, the one or more angled conductive sheets 72 are "sandwiched" between the corresponding conductive sheets 12, 26 of the first and second layers. In particular, the angled conductive sheet 72 is secured to one or more conductive sheets 12 of the first layer at the surface joint 70 during assembly of the EMP shield at one of the surfaces 14 directly adjacent the surface joint 70. When the second layer of conductive sheets 26 is secured to the first layer in block 112, one or more of the conductive sheets 26 of the second layer is also secured to the corresponding leg 76 of the angled conductive sheet 72. For example, in some embodiments, the conductive sheets 26 of the second layer may also be "quilted" to the angled conductive sheet 72. Although the assembly of the EMP shield is described primarily in reference to a portion of a single surface 14, it should be appreciated that the conductive sheets 12 of the first layer are secured to both surfaces 14 that meet to form the surface joint 70 prior to installation of the angled conductive sheet 72 at that surface joint 70. It should further be appreciated that the conductive sheets 12, 26 and the surfaces 14 are shown only in part and may extend further in the longitudinal direction 18 and/or the transverse 19 direction. In circumstances in which three surfaces 14 meet at a surface joint 70 (e.g., two walls and the ceiling), a modified version of the angled conductive sheet 72 shown and described in reference to FIGS. 9-10 may be used consistent with the techniques described herein.

In block 120, a protective coating is applied to the second layer of conductive sheets 26. More specifically, in the illustrative embodiment, the protective coating is applied to all exposed surfaces of the EMP shield, for example, to prevent flaking of zinc galvanization (i.e., zinc "whispers"). Depending on the particular embodiment, the protective coating may be composed of epoxy paint, thermoplastic, or another suitable material.

Figure 11:
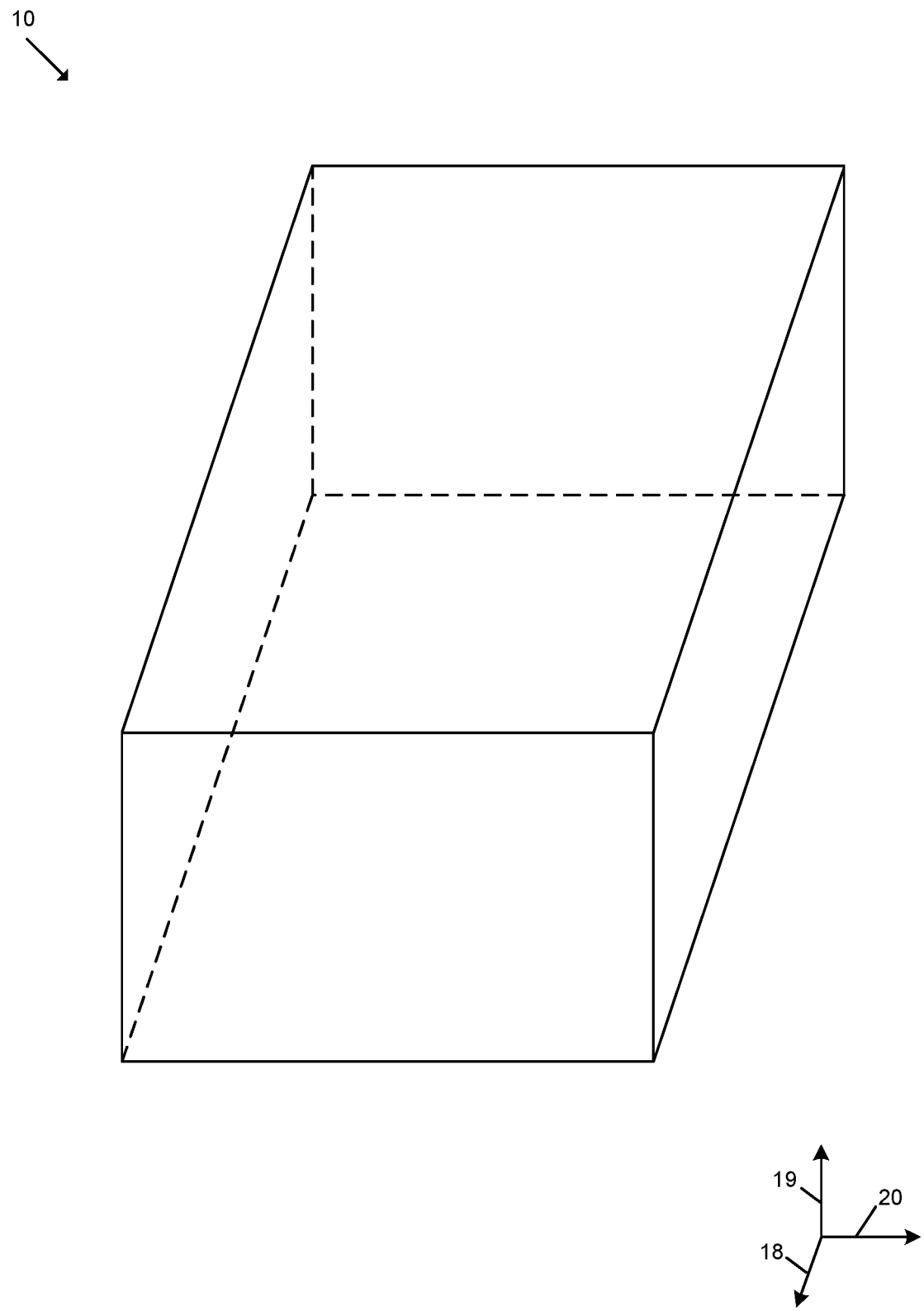
FIG. 11 is a perspective view of an embodiment of the assembled EMP shield.

Referring now to FIG. 11, an illustrative embodiment of an EMP shield 10 assembled according to the techniques described herein is shown. In the illustrative embodiment, the EMP shield 10 is shaped like a rectangular prism corresponding with a similarly shaped building structure (not shown) to which the EMP shield 10 is secured. Accordingly, in the illustrative embodiment, the EMP shield 10 includes six surfaces that are secured to four wall surfaces, a ceiling surface, and a floor surface of the building structure. As described above, the EMP shield 10 defines a secure chamber within which, for example, critical electronics equipment may be positioned for protection from potential EMPs.

Of course, in other embodiments, the building structure may be otherwise shaped. In many such embodiments, the surfaces of the EMP shield 10 may be sized and shaped to fit the shape of the building structure. For example, in various embodiments, the EMP shield 10 may be shaped like a regular or irregular polyhedron to match the shape of a building structure. Similarly, in some embodiments, the EMP shield 10 may include one or more curved surfaces. It should further be appreciated that certain doors, door frames, wave guides, and/other ingress/egress mechanisms may be installed in the EMP shield 10 in a manner that does not diminish the electromagnetic shielding provided by the techniques described herein.

What is claimed is:

1. A method, comprising:
   securing a first plurality of conductive sheets to a surface;
   applying a conductive tape to a first plurality of joints between conductive sheets of the first plurality of conductive sheets; and
   securing a second plurality of conductive sheets to the first plurality of conductive sheets without fully penetrating the first plurality of conductive sheets,
   wherein each of a second plurality of joints between conductive sheets of the second plurality of conductive sheets is offset relative to the first plurality of joints, and
   wherein securing the second plurality of conductive sheets to the first plurality of conductive sheets comprises screwing the second plurality of conductive sheets to the first plurality of conductive sheets with self-tapping screws without fully penetrating the first plurality of conductive sheets.

2. The method of claim 1, wherein each conductive sheet of the first plurality of conductive sheets and the second plurality of conductive sheets comprises galvanized sheet metal.

3. The method of claim 1, wherein the conductive tape comprises an aluminum backing and a conductive acrylic adhesive.

4. The method of claim 1, wherein securing the first plurality of conductive sheets to the surface comprises:
   placing the first plurality of conductive sheets on the surface adjacent one another; and
   screwing the first plurality of conductive sheets to the surface.

5. The method of claim 4, wherein screwing the first plurality of conductive sheets to the surface comprises screwing the first plurality of conductive sheets to the surface using screws having a low-profile head such that the screws have a reduced head height.

6. The method of claim 1, wherein securing the second plurality of conductive sheets to the first plurality of conductive sheets comprises:
   placing the second plurality of conductive sheets adjacent one another and on the first plurality of conductive sheets such that (i) each longitudinal joint between conductive sheets of the second plurality of conductive sheets is offset from each longitudinal joint between conductive sheets of the first plurality of conductive sheets by a first distance and (ii) each lateral joint between conductive sheets of the second plurality of conductive sheets is offset from each lateral joint between conductive sheets of the first plurality of conductive sheets by a second distance.

7. The method of claim 6, wherein each conductive sheet of the first plurality of conductive sheets and the second plurality of conductive sheets has a same length and width; and
   wherein the first distance is half the width and the second distance is half the length.

8. The method of claim 1, wherein screwing the second plurality of conductive sheets to the first plurality of conductive sheets with the self-tapping screws comprises screwing the second plurality of conductive sheets to the first plurality of conductive sheets with the self-tapping screws at every nine inches in both a longitudinal direction and a lateral direction.

9. The method of claim 1, wherein securing the first plurality of conductive sheets to the surface comprises securing the first plurality of conductive sheets to the surface using at least one of an adhesive or lead anchor pins.

10. The method of claim 1, wherein each conductive sheet of the first and second plurality of conductive sheets is composed of at least one material that permits dissipation of electromagnetic pulses.

11. The method of claim 1, wherein applying the conductive tape to the first plurality of joints between the conductive sheets of the first plurality of conductive sheets creates at least one electrical short between the conductive sheets.

12. The method of claim 1, further comprising applying a protective coating to the second plurality of conductive sheets.

13. The method of claim 12, wherein the protective coating comprises at least one of epoxy paint or thermoplastic.

14. A method, comprising:
   securing a first plurality of conductive sheets to a surface;
   applying a conductive tape to a first plurality of joints between conductive sheets of the first plurality of conductive sheets; and
   securing a second plurality of conductive sheets to the first plurality of conductive sheets without fully penetrating the first plurality of conductive sheets,
   wherein:
   the surface is a first surface that meets a second surface at a surface joint,
   each of a second plurality of joints between conductive sheets of the second plurality of conductive sheets is offset relative to the first plurality of joints,
   securing the second plurality of conductive sheets to the first plurality of conductive sheets comprises screwing the second plurality of conductive sheets to the first plurality of conductive sheets with self-tapping screws without fully penetrating the first plurality of conductive sheets, and
   the method further comprises (i) securing an angled conductive sheet to at least one conductive sheet of the first plurality of conductive sheets at the surface joint and iii) securing at least one conductive sheet of the second plurality of conductive sheets to the angled conductive sheet.

15. The method of claim 14, wherein the first surface is a floor surface and the second surface is a wall surface.

16. The method of claim 14, wherein the first surface is a wall surface and the second surface is one of a ceiling surface or a floor surface.

17. The method of claim 14, wherein the first surface is a ceiling surface and the second surface is a wall surface.

* * * * *